(12) United States Patent
Liu et al.

(10) Patent No.: US 12,431,098 B2
(45) Date of Patent: Sep. 30, 2025

(54) SILICON-BASED DISPLAY ASSEMBLY AND DISPLAY DEVICE

(71) Applicant: SeeYa Optronics, Co., Ltd., Shanghai (CN)

(72) Inventors: Ping-Lin Liu, Shanghai (CN); Haodong Zhang, Shanghai (CN); Yanfu Huang, Shanghai (CN)

(73) Assignee: SeeYa Optronics Co., Ltd., Shanghai (CN)

( * ) Notice: Subject to any disclaimer, the term of this patent is extended or adjusted under 35 U.S.C. 154(b) by 0 days.

(21) Appl. No.: 18/867,785

(22) PCT Filed: Nov. 30, 2023

(86) PCT No.: PCT/CN2023/135565
§ 371 (c)(1),
(2) Date: Nov. 20, 2024

(87) PCT Pub. No.: WO2025/097519
PCT Pub. Date: May 15, 2025

(65) Prior Publication Data
US 2025/0149001 A1    May 8, 2025

(30) Foreign Application Priority Data
Nov. 7, 2023    (CN) .......................... 202311474471.1

(51) Int. Cl.
G09G 3/3291    (2016.01)
G09G 3/20    (2006.01)
H10K 59/131    (2023.01)

(52) U.S. Cl.
CPC ......... *G09G 3/3291* (2013.01); *G09G 3/2096* (2013.01); *H10K 59/131* (2023.02);
(Continued)

(58) Field of Classification Search
CPC ............... G09G 3/3291; G09G 3/2096; G09G 2310/0286; G09G 2310/0289; G09G 2310/0291; G09G 2330/028; H10K 59/131

See application file for complete search history.

(56) References Cited

U.S. PATENT DOCUMENTS

| 11,081,036 B1 * | 8/2021 | Wang ....................... H03K 5/24 |
| 2007/0126721 A1 | 6/2007 | Kurokawa |

(Continued)

FOREIGN PATENT DOCUMENTS

| CN | 102663984 A | 9/2012 |
| CN | 106205454 A | 12/2016 |

(Continued)

OTHER PUBLICATIONS

International Search Report and Written Opinion dated Jul. 9, 2024, in connection with International Application PCT/CN2023/135565.

(Continued)

*Primary Examiner* — Stacy Khoo
(74) *Attorney, Agent, or Firm* — Wolf, Greenfield & Sacks, P.C.

(57) ABSTRACT

Provided are a silicon-based display assembly and a display device. The silicon-based display assembly is provided with a silicon-based panel, a flexible circuit board, and a logic control board. An end of the flexible circuit board is bonded to a first bonding region of the silicon-based panel. The logic control board is disposed on the flexible circuit board. The logic control board is integrated with a timing controller module, an algorithm processing module, a first input interface module, a first output interface module, and a power module. The logic control board is configured to at least perform high-speed data receiving and high-speed data processing.

12 Claims, 9 Drawing Sheets

(52) U.S. Cl.
CPC ............... *G09G 2310/0286* (2013.01); *G09G 2310/0289* (2013.01); *G09G 2310/0291* (2013.01); *G09G 2330/028* (2013.01)

(56) References Cited

U.S. PATENT DOCUMENTS

| | | |
|---|---|---|
| 2011/0119590 A1 | 5/2011 | Seshadri |
| 2015/0002488 A1 | 1/2015 | Hwang |
| 2020/0160782 A1* | 5/2020 | Qian ................... H10K 59/127 |
| 2023/0048669 A1 | 2/2023 | Liu et al. |

FOREIGN PATENT DOCUMENTS

| | | |
|---|---|---|
| CN | 109935195 A | 6/2019 |
| CN | 111930663 A | 11/2020 |
| CN | 112102770 A | 12/2020 |
| CN | 112365838 A | 2/2021 |
| CN | 113748514 A | 12/2021 |
| CN | 114245568 A | 3/2022 |
| CN | 114333694 A | 4/2022 |
| CN | 116631325 A | 8/2023 |

OTHER PUBLICATIONS

Chinese Office Action dated Dec. 19, 2023, in connection with Chinese Application No. 202311474471.1, with English translation thereof.
Chinese Notification to Grant Patent Right for Invention dated Jan. 4, 2024, in connection with Chinese Application No. 20231147447.1.

\* cited by examiner

SILICON-BASED DISPLAY ASSEMBLY AND DISPLAY DEVICE

This application claims priority to Chinese patent application No. 202311474471.1 filed with China National Intellectual Property Administration (CNIPA) on Nov. 7, 2023, the disclosure of which is incorporated herein by reference in its entirety.

TECHNICAL FIELD

Embodiments of the present application relate to the field of display technology, for example, a silicon-based display assembly and a display device.

BACKGROUND

A silicon-based organic light-emitting diode (OLED) product (for example, a silicon-based OLED micro-display device) is different from a conventional active-matrix organic light-emitting diode (AMOLED) panel device that uses an amorphous silicon thin-film transistor, a microcrystalline silicon thin-film transistor, or a low-temperature polysilicon thin-film transistor as a backplane. The silicon-based OLED product uses a monocrystalline silicon chip as the substrate, has a pixel size that is one-tenth of the pixel size of a conventional display device, and is much more precise than the conventional device. A silicon-based OLED display panel (including a silicon-based OLED chip) may adopt a mature integrated circuit complementary metal oxide semiconductor (CMOS) process. In this manner, not only the active addressing matrix of the display pixels of a display screen OLED is implemented, but also a drive control circuit having multiple functions can be implemented on the silicon-based OLED display panel, thereby reducing the external connection lines of the device, increasing the reliability, and implementing lightweight.

To use different levels of manufacturing processes to prepare the active addressing matrix portion and the drive control circuit portion and implement high-resolution and high-frame-rate driving, the silicon-based OLED product generally chooses to remove the drive control circuit portion from the monocrystalline silicon chip and prepare the drive control circuit portion independently, and then use the drive control circuit portion as a display driver integrated circuit (DDIC) and bond the drive control circuit portion to the monocrystalline silicon chip.

However, in the preceding solution, since the DDIC is not only integrated with the functions for receiving, processing, and compressing high-speed data and high-speed images, but also integrated with an active signal driving portion, the DDIC is limited by the fact that the active signal driving portion needs to be electrically connected to signal lines such as data lines and power lines on the silicon-based OLED chip, that is, the input pad on the DDIC needs to be boned to the input pad on the monocrystalline silicon chip, which is used as signal input and power input. Thus, the DDIC needs to be designed in an elongated shape. However, this shape is not conducive to the design and layout of high-speed functional regions such as image compression, image processing, and image algorithms.

SUMMARY

The present application provides a silicon-based display assembly and a display device, so that a high-speed portion that requires an image compression function, an image processing function, and an image algorithm function may be freely designed in shape to implement a relatively square layout, reduce design and manufacturing difficulties, and save costs.

In a first aspect, an embodiment of the present application provides a silicon-based display assembly. The silicon-based display assembly includes a silicon-based panel, a flexible circuit board, and a logic control board.

The silicon-based panel includes a display region, a gate row driver circuit, a source signal driver circuit, and a first bonding region. The display region includes multiple data signal lines and multiple gate scanning lines. The multiple data signal lines are arranged in sequence in a first direction and extend in a second direction. The multiple gate scanning lines are arranged in sequence in the second direction and extend in the first direction. The display region also includes multiple pixel units formed by the intersection of the data signal lines and the gate scanning lines. The gate row driver circuit is configured to provide a gate scanning signal to the gate scanning lines. The source signal driver circuit is configured to provide a data signal to the data signal lines. The first direction and the second direction are two directions arbitrarily intersecting on the plane where the silicon-based panel is located.

The flexible circuit board has an end bonded to the first bonding region.

The logic control board is disposed on the flexible circuit board.

The logic control board is integrated with a timing controller module, an algorithm processing module, a first input interface module, a first output interface module, and a power module. The logic control board is configured to at least perform high-speed data receiving and high-speed data processing.

In a second aspect, an embodiment of the present application provides a display device including the silicon-based display assembly described in the first aspect.

DETAILED DESCRIPTION

Figure 1:
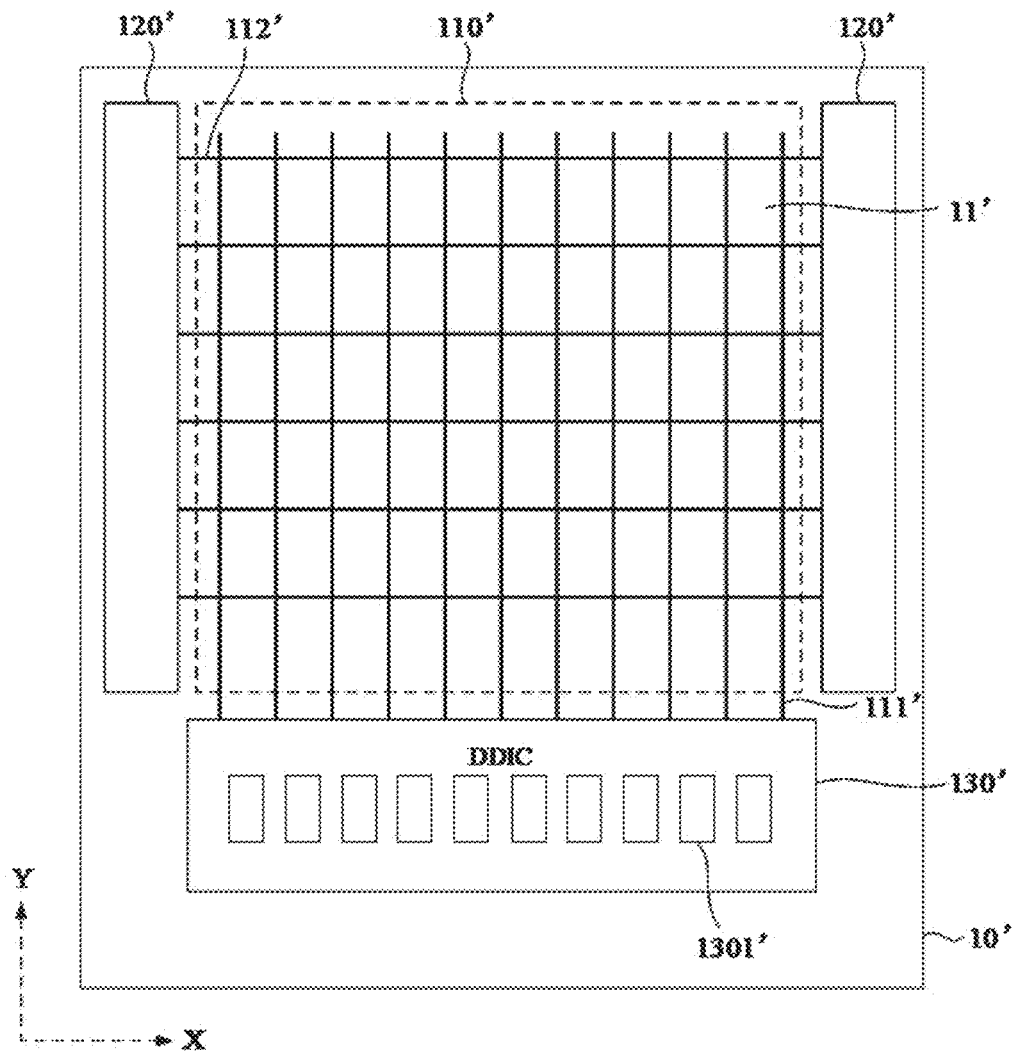
FIG. 1 is a diagram illustrating the structure of a silicon-based display assembly according to an embodiment.

The present application is described below in conjunction with drawings and embodiments.

Terms used in embodiments of the present application are intended only to describe embodiments and not to limit the present application. Nouns of locality such as "above", "below", "left" and "right" in the embodiments of the present application are described from angles shown in the drawings and are not to be construed as limiting the embodiments of the present application. Additionally, in the context, when an element is formed "above" or "below" another element, the element can not only be directly formed "above" or "below" the other element but also be indirectly formed "above" or "below" the other element via an intermediate element. Terms such as "first" and "second" are used only for the purpose of description to distinguish between different components and not to indicate any order, quantity, importance, or interdependence.

As used herein, the term "include" and variations thereof are intended to be inclusive, that is, "including, but not limited to". The term "based on" is "at least partially based on". The term "one embodiment" indicates "at least one embodiment".

FIG. 1 is a diagram illustrating the structure of a silicon-based display assembly according to an embodiment. Referring to FIG. 1, in the silicon-based display assembly, a monocrystalline silicon chip 10' includes a display region 110', a gate row driver circuit 120', and a display driver integrated circuit (DDIC) 130'. The display region 110' includes multiple data signal lines 111' and multiple gate scanning lines 112'. Multiple pixel units 11' are formed by the intersection of the data signal lines 111' and the gate scanning lines 112'. The display driver chip 130' is boned outside the display region 110' of the monocrystalline silicon chip 10'. The DDIC 130' is integrated with an active signal driving portion. The active signal driving portion needs to provide a corresponding drive signal, such as a data signal and a power signal, to the data signal lines 111' and power signal lines (not shown in the figure) in the display region 110'. Thus, due to the limitation of the function of the active signal driving portion, the DDIC 130' needs to be provided with a pin to be bonded to the pad 1301' disposed on the monocrystalline silicon chip 10' and connected to the data signal lines 111' and the power signal lines through the pad 1301' on the monocrystalline silicon chip 10', which are used as signal input and power input. For example, a silicon-based display assembly having 8K resolution (7680×4320 resolution) and 120 Hz frame rates is used as an example. The number of data signal lines 111' for driving R, G, and B pixel units is 4320×3=12960, that is, the number of pads 1301' between the monocrystalline silicon chip 10' and the DDIC 130' is as many as 12960, and the pads 1301' are arranged in the X direction shown in FIG. 1. Thus, due to the limitation of the fact that the active signal driving portion needs to be bonded to the pads 1301', the shape of the DDIC 130' needs to be set to be an elongated shape. However, since the DDIC 130' is not only integrated with the active signal driving portion, but also integrated with the receiving, processing, and compression modules of high-speed data and high-speed images, the elongated shape is not conducive to the design and layout of the receiving, processing, and compressing modules of high-speed data and high-speed images.

Figure 2:
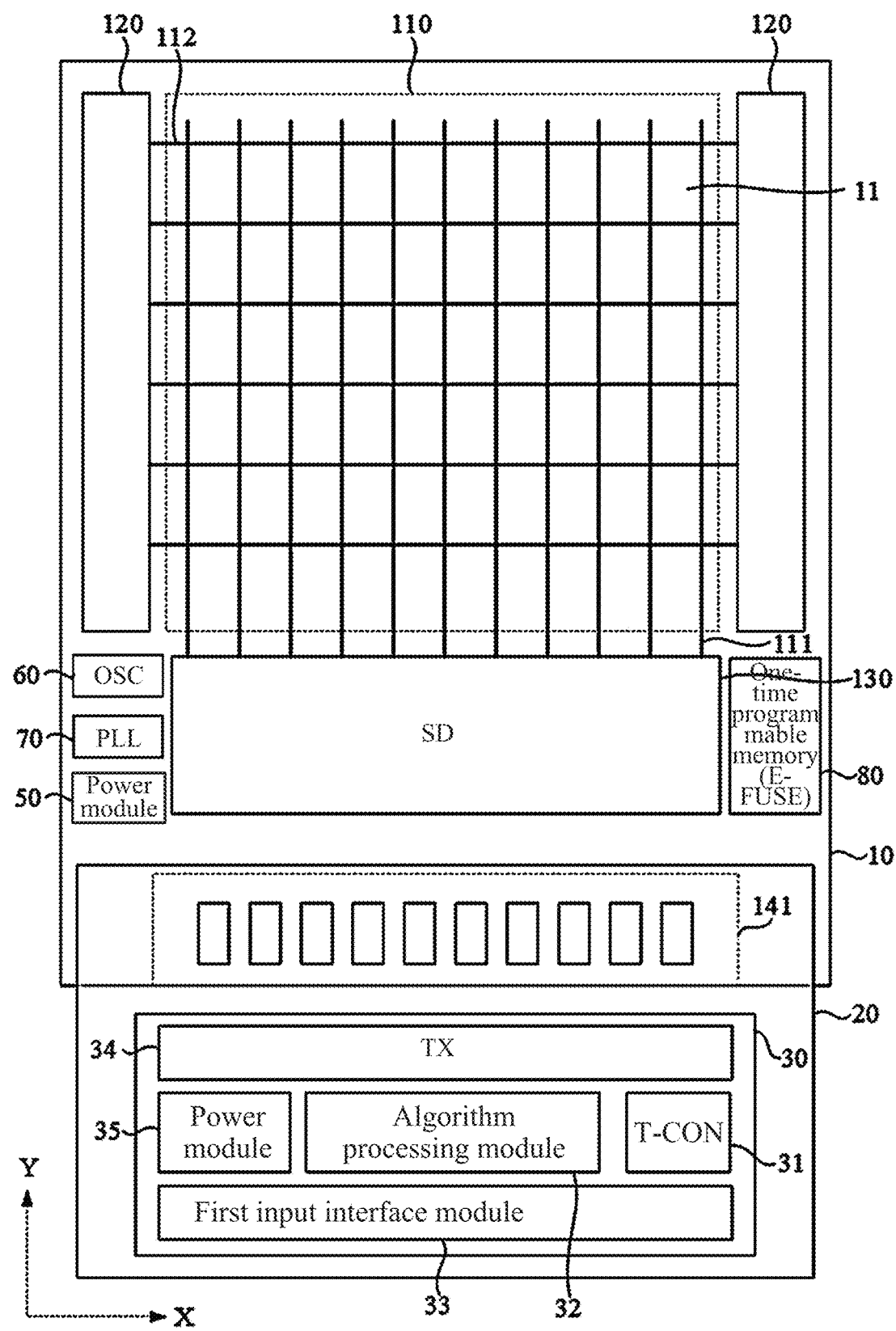
FIG. 2 is a diagram illustrating the structure of a silicon-based display assembly according to an embodiment of the present application.

An embodiment of the present application provides a silicon-based display assembly. FIG. 2 is a diagram illustrating the structure of a silicon-based display assembly according to an embodiment of the present application. Referring to FIG. 2, the silicon-based display assembly includes a silicon-based panel 10, a flexible circuit board 20, and a logic control board 30.

The silicon-based panel 10 includes a display region 110, a gate row driver circuit 120, a source signal driver (SD) circuit 130, and a first bonding region 141. The display region 110 includes multiple data signal lines 111 and multiple gate scanning lines 112. The multiple data signal lines 111 are arranged in sequence in a first direction X and extend in a second direction Y. The multiple gate scanning lines 112 are arranged in sequence in the second direction Y and extend in the first direction X. The display region 110 also includes multiple pixel units 11 formed by the intersection of the data signal lines 111 and the gate scanning lines 112. The gate row driver circuit 120 is configured to provide a gate scanning signal to the gate scanning lines 112. The source signal driver circuit 130 is configured to provide a data signal to the data signal lines 111. The first direction X and the second direction Y are two directions arbitrarily intersecting on the plane where the silicon-based panel 10 is located.

An end of the flexible circuit board 20 is bonded to the first bonding region 141 of the silicon-based panel 10.

The logic control board 30 is disposed on the flexible circuit board 20. The logic control board 30 is integrated with a timing controller (T-CON) module 31, an algorithm processing module 32, a first input interface module 33, a first output interface module (TX) 34, and a power module 35. The logic control board 30 is configured to at least perform high-speed data receiving and high-speed data processing.

The silicon-based panel 10 is configured to integrate an active addressing matrix. Specifically, the silicon-based panel 10 is provided with the display region 110. The display region 110 is a region where the active addressing matrix is integrated and is responsible for implementing a display function by addressing drive. The display region 110 is provided with multiple gate scanning lines 112 extending in the first direction X (for example, a row direction) and multiple data signal lines 111 extending in the second direction Y (for example, a column direction). The data signal lines 111 and the gate scanning lines 112 intersect to define multiple pixel units 11. The multiple pixel units 11 form the active addressing matrix, and the pixel units 11 may be addressed through the gate scanning lines 112 and the data lines 111, thereby driving the pixel units 11 to display. In addition to the display region 110, the silicon-based panel 10 is also provided with the gate row driver circuit 120 and the source signal driver circuit 130 for addressing and driving the display region 110 to display an image. In the figure, for example, gate row driver circuits 120 are located on two sides of the display region 110, and the source signal driver circuit 130 is located on the lower side of the display region 110. In other embodiments, a gate row driver circuit 120 may also be disposed on only one side of the display region. In this embodiment, the gate row driver circuits 120 on two sides may drive gate scanning lines 112 of odd and even rows respectively or may be connected to two ends of the same gate scanning line 112 for synchronous driving. The gate row driver circuit 120 sequentially provides a gate scanning signal to the multiple gate scanning lines 112 to turn on the pixel units 11 of the rows corresponding to the multiple gate scanning lines 112. At the same time, the source signal driver circuit 130 sequentially provides a data signal to the multiple data signal lines 111, so that the multiple pixel units 11 are displayed at target brightness, thereby forming the entire target image.

The process in which the source signal driver circuit 130 and the gate row driver circuit 120 drive the display region 110 to display is essentially that after image data is input from the outside, the image data is converted into a timing signal and a data signal, provided to the gate row driver circuit 120 and the source signal driver circuit 130 respectively, and then transmitted to corresponding signal lines of the display region 110 by the gate row driver circuit 120 and the source signal driver circuit 130.

For the reception and processing functions of the image data input from the outside, in this embodiment of the present application, these functions are concentrated on the logic control board 30. Specifically, in this embodiment of the present application, the logic control board 30 is electrically connected to the silicon-based panel 10 by the encapsulation method of a chip on film (COF) substantially. The logic control board 30 is attached to the flexible circuit board 20 as a chip, and the flexible circuit board 20 is bonded to the first bonding region 141 of the silicon-based panel 10. In this manner, the flexible circuit board 20 receives external image data, is responsible for processing the image data, and then inputs the processed data signal from the flexible circuit board 20 to the silicon-based panel 10 for display and driving. The first bonding region 141 is a region disposed outside the display region 110 of the silicon-based panel 10 and is responsible for being connected to an external structure by an external connection device such as the flexible circuit board 20.

In this embodiment, in addition, when the logic control board 30 is responsible for the high-speed data reception function and high-speed data processing function, the logic control board 30 is responsible for need to be provided with the timing control module 31 and the algorithm processing module 32. The algorithm processing module 32 is configured to perform data processing. The timing control module 31 is responsible for generating a timing control signal. The first input interface module 33 and the first output interface module (TX) 34 are responsible for receiving the image data input from the outside and outputting the timing control signal to the silicon-based panel 10 respectively. The power module 35 is responsible for supplying power to the module on the logic control board 30.

As described above, in this embodiment of the present application, essentially, the functional units required for high-speed data reception, high-speed data processing, high-speed image compression, and high-speed image processing in the silicon-based display assembly are integrated on an independently prepared logic control board 30, and the electrical connection is implemented through a chip on film. At this time, the silicon-based panel 10 and the logic control board 30 may be manufactured as independent chips through production lines of different process capabilities. Specifically, considering that the logic control board 30 needs to perform high-speed data processing, there is a data processing speed requirement. Thus, a relatively high-level process technology, such as 28-nanometer process technology, may be used for preparation to ensure that the chips 30 are prepared in a smaller area and have a higher yield. For the silicon-based panel 10, the area of the silicon-based OLED having high resolution is relatively large, and the corresponding preparation requirement is relatively low. Thus, a relatively low-level process technology, such as 55-nanometer process technology, may be used for preparation to implement the object of reducing costs.

In the technical solution of the preceding embodiment, the silicon-based display assembly is provided with a silicon-based panel, a flexible circuit board, and a logic control board. The silicon-based panel includes a display region, a gate row driver circuit, a source signal driver circuit, and a first bonding region. The display region includes multiple data signal lines and multiple gate scanning lines. The multiple data signal lines are arranged in sequence in the first direction and extend in the second direction. The multiple gate scanning lines are arranged in sequence in the second direction and extend in the first direction. The display region also includes multiple pixel units formed by the intersection of the data signal lines and the gate scanning lines. The gate row driver circuit is configured to provide the gate scanning signal to the gate scanning lines. The source signal driver circuit is configured to provide the data signal to the data signal lines. The first direction and the second direction are two directions arbitrarily intersecting on the plane where the silicon-based panel is located. The flexible circuit board has an end bonded to the first bonding region. The logic control board is disposed on the flexible circuit board. The logic control board is integrated with a timing control module, an algorithm processing module, a first input interface module, a first output interface module, and a power module. The logic control board is configured to at least perform high-speed data receiving and high-speed data processing.

Referring to FIG. 1, in a display device having high resolution, for example, 8K resolution, the DDIC 130' needs to be set in an elongated shape, so that a pad 1301' connected to a data line 111' is correspondingly disposed. At the same time, the DDIC 130' is also provided with receiving, processing, and compression modules of high-speed data and high-speed images. In an elongated layout, these modules may have problems such as limited disposition positions, an unreasonable layout, and large occupied area. For example, there is the problem of the extent of the length of the DDIC 130' in the second direction Y. In this embodiment of the present application, the function module in the DDIC 130' shown in FIG. 1 is split into two components for distribution: a source signal driver circuit 130 and a logic control board 30. The source signal driver circuit 130 is set in an elongated shape to be connected to a data line 111' correspondingly. The logic control board 30 is provided with other modules to avoid the limitation of the disposition of other modules due to the elongated layout. In addition, the logic control board 30 may be electrically connected to the silicon-based panel 10 through the flexible circuit board 20. The flexible circuit board 20 may be flipped as a whole toward the back side of the silicon-based panel 10 and placed in coincidence with the silicon-based panel 10. The flexible circuit board 20 and the logic control board 30 disposed on the flexible circuit board 20 do not occupy additional area. In addition, the source signal driver circuit 130 and the silicon-based panel 10 may be prepared by using a lower-level process technology, for example, 55-nanometer process technology, and the logic control board 30 may be prepared by using a relatively high-level process technology, for example, 28-nanometer process technology, thereby reducing costs.

In summary, this embodiment of the present application solves the problem that the elongated design of the display driver chip in the silicon-based display assembly is not conducive to the layout of a high-speed portion. Thus, the logic control board that requires image compression, image processing, and image algorithm functions can be no longer limited by the long strip-shaped bonding region on the silicon-based panel and may be freely designed in shape to implement a relatively square layout. In this manner, it is beneficial to reduce design and manufacturing difficulties, simplify the complexity of the manufacturing process, save costs, and reduce the occupied area, which is more applicable to miniaturized and micro-miniaturized display.

Figure 3:
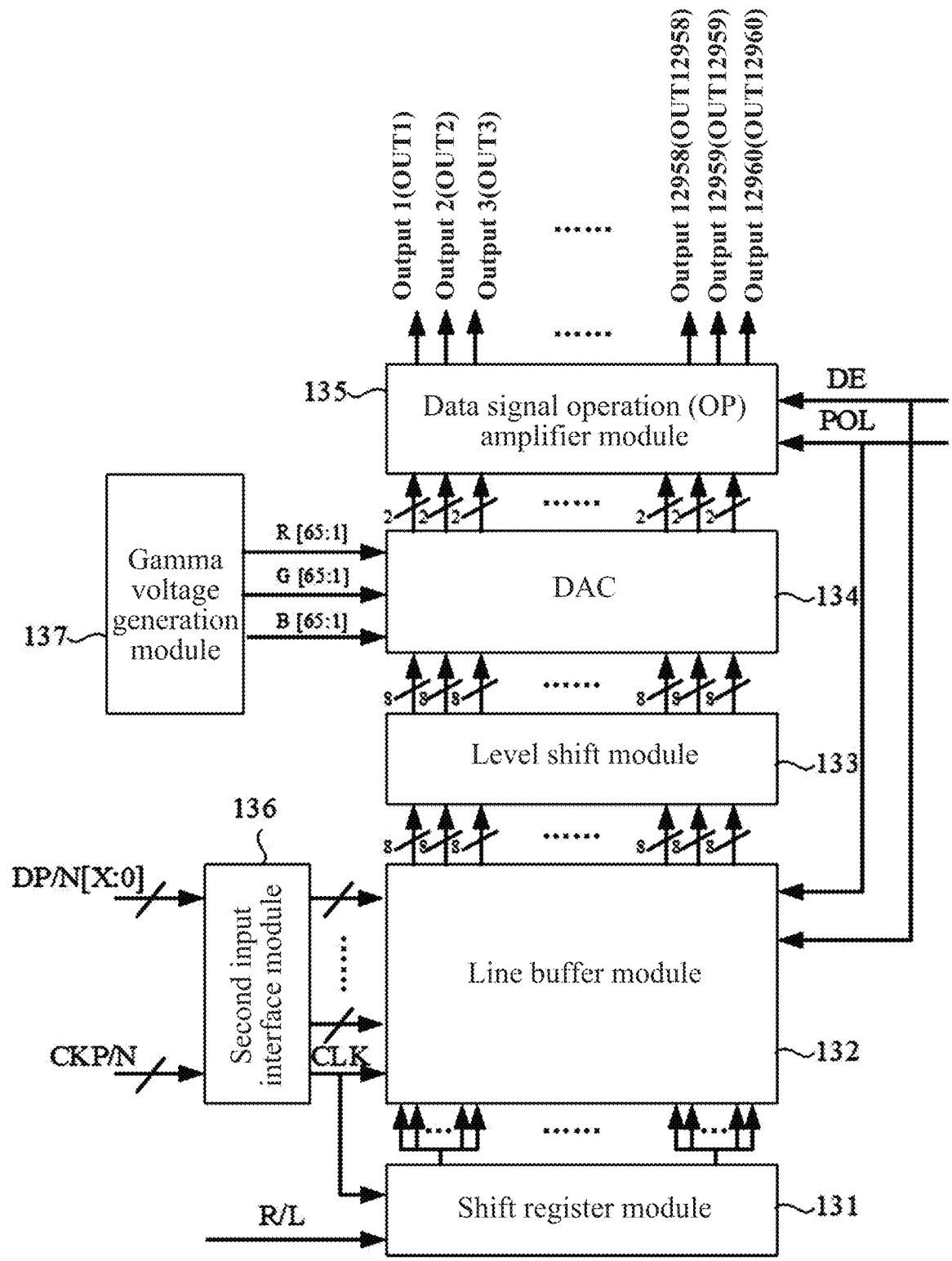
FIG. 3 is a diagram illustrating the structure of a source signal driver circuit in the silicon-based display assembly shown in FIG. 2.

FIG. 3 is a diagram illustrating the structure of a source signal driver circuit in the silicon-based display assembly shown in FIG. 2. Referring to FIG. 2 and FIG. 3, in an embodiment of the present application, optionally, the source signal driver circuit 130 is integrated with a shift register module 131, a line buffer module 132, a level shift module 133, a digital-to-analog conversion (DAC) module 134, a data signal operation (OP) amplifier module 135, a second input interface module 136, and a gamma voltage generation module 137.

The shift register module 131, the line buffer module 132, the level shift module 133, the digital-to-analog conversion module 134, and the data signal operation (OP) amplifier module 135 are electrically connected in sequence. The second input interface module 136 is electrically connected to the shift register module 131. The gamma voltage generation module 137 is electrically connected to the digital-to-analog conversion module 134. The communication protocol of the second input interface module 136 matches the communication protocol of the first output interface module 34.

Since the logic control board 30 is responsible for performing high-speed data receiving and high-speed data processing, the interface module integrated on the logic control board 30 needs to be set as a high-speed interface. For the silicon-based panel 10, the data signal output process of the source signal driver circuit 130 on the silicon-based panel 10 is relatively low in data transmission speed. Thus, in a specific embodiment of the present application, optionally, the first input interface module 33 is a high-speed interface module, and the first output interface module 34 and the second input interface module 136 are low-speed interface modules. More specifically, the high-speed interface module may select interfaces such as a MIPI interface and an eDP interface. A low-speed interface module may select interfaces such as a LVDS interface and a P2P interface. The MIPI interface refers to a mobile industry processor interface (MIPI) alliance interface. The eDP interface refers to an embedded display port (eDP). The LVDS interface refers to a low voltage differential signaling (LVDS) interface. The P2P interface refers to a point-to-point (P2P) signaling interface. Relatively speaking, the transmission rate of the MIPI interface and the transmission rate of the eDP interface are far higher than the transmission rate of the LVDS interface and the transmission rate of the P2P interface, so that the MIPI interface and the eDP interface may be used for transmitting high-speed data to the outside.

The workflow of each module in the source signal driver circuit 130 in FIG. 3 is described as follows: First, the second input interface module 136 communicates with the first output interface module (TX) 34 at high speed to obtain an image data signal, a synchronization signal, and a data write control signal input from the outside; the synchronization signal and the data write control signal may be used to distinguish the data signal corresponding to a pixel unit in the image data signal; and the shift register module 131 and the line buffer module 132 are responsible for storing the data signals of multiple pixel units according to the synchronization signal and the data write control signal. At this time, the data signals stored in the shift register module 131 and the line buffer module 132 are low voltage digital signals. The level shift module 133 and the digital-to-analog conversion module (DAC) 134 are responsible for converting the data signal into an analog signal. The gamma voltage generation module 137 can output a gamma voltage to the digital-to-analog conversion module (DAC) 134, so that the digital-to-analog conversion module (DAC) 134 converts multiple data drive signals into analog display drive signals in a one-to-one correspondence manner according to the gamma voltage and a data drive signal, thereby outputting the analog display drive signals to the data signal operation (OP) amplifier module 135 electrically connected to the digital-to-analog conversion module.

Further referring to FIG. 1, in a related silicon-based display assembly, since there are a large number of pads 1301', poor contact easily occurs during the process in which the pins of the display driver chip are bonded to the pads 1301' of the display driver chip in a one-to-one correspondence manner. As a result, a relatively large yield problem exists. As shown in FIG. 2, in this embodiment of the present application, the high-speed data receiving function and the high-speed data processing function are integrated on the logic control board 30 and are bonded and connected to the silicon-based panel 10 through the flexible circuit board 20. At the same time, the active signal driving portion of the display driver chip is directly integrated on the silicon-based panel 10 in the form of the source signal driver circuit 130 without chip bonding. In this manner, the problem of poor binding of data lines and pins can be effectively avoided, and it is beneficial to improve the quality of the silicon-based display assembly.

Figure 4:
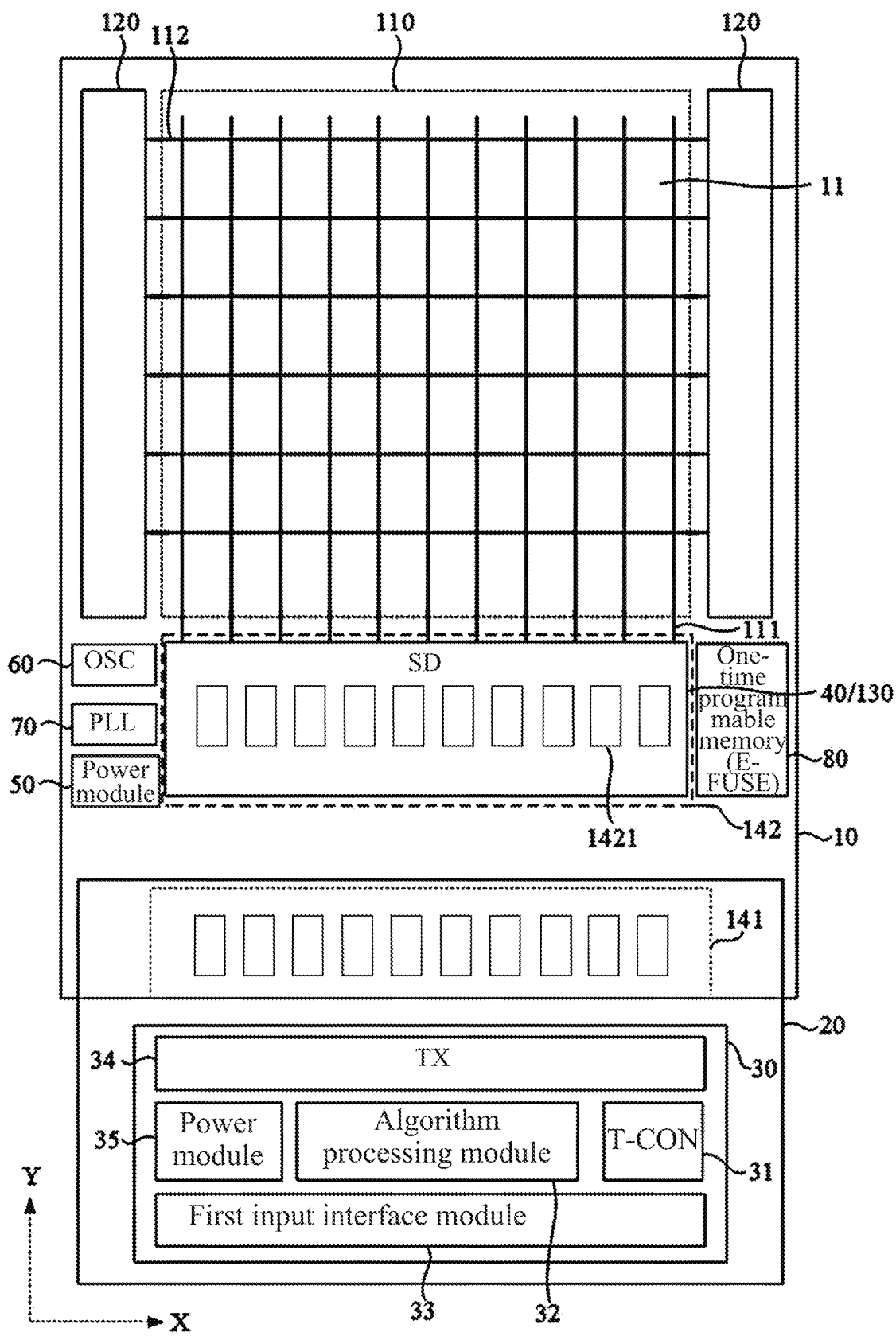
FIG. 4 is a diagram illustrating the structure of another silicon-based display assembly according to an embodiment of the present application.

FIG. 4 is a diagram illustrating the structure of another silicon-based display assembly according to an embodiment of the present application. Referring to FIG. 3 and FIG. 4, in another embodiment of the present application, optionally, the silicon-based display assembly also includes a source signal driver chip 40. The source signal driver chip 40 is bonded to the silicon-based panel 10.

The source signal driver circuit 130 is integrated in the source signal driver chip 40. The source signal driver chip 40 includes a shift register module 131, a line buffer module 132, a level shift module 133, a digital-to-analog conversion module 134, a data signal operation amplifier module 135, a second input interface module 136, and a gamma voltage generation module 137.

The shift register module 131, the line buffer module 132, the level shift module 133, the digital-to-analog conversion module 134, and the data signal operation amplifier module 135 are electrically connected in sequence. The second input interface module 136 is electrically connected to the shift register module 131. The gamma voltage generation module 137 is electrically connected to the digital-to-analog conversion module 134. The communication protocol of the second input interface module 136 matches the communication protocol of the first output interface module 34.

In this embodiment, the silicon-based panel 10 also includes a second bonding region 142. The second bonding region 142 includes multiple pads 1421. The source signal driver chip 40 is bonded to the silicon-based panel 10 through the pads 1421.

Similarly, in the embodiment, optionally, the first input interface module 33 is a high-speed interface module, and the first output interface module 34 and the second input interface module 136 are low-speed interface modules. More specifically, the high-speed interface module may select interfaces such as a LVDS interface and a P2P interface. A low-speed interface module may select interfaces such as a MIPI interface and an eDP interface.

In the preceding embodiment, as shown in FIG. 3, a related module in the source signal driver circuit such as image data signal buffering and conversion is integrated onto an independent driver chip, that is, the source signal driver chip 40. A bonding region, that is, a second bonding region 142 is disposed on the silicon-based panel 10 for bonding to implement the driving process of a source signal. The workflow of multiple modules is described above and may not be repeated here. It is to be understood that the related function module driven by the source signal is independently designed in a chip. Similarly, a higher generation production line, such as a 28 nm technique, may be used for manufacturing the chip to implement an elongated layout. At the same time, a high-speed interface is used for data reception to ensure data processing speed. In the embodiment shown in FIG. 4, the source signal driver chip 40 and the logic control board 30 are set as two independent components. The source signal driver ship 40 is set in an elongated shape to be connected to a data line correspondingly. The logic control board 30 is independently disposed without being limited by the shape of the source signal driver chip 40. The logic control board 30 may be electrically connected to the silicon-based panel 10 through the flexible circuit board 20. The flexible circuit board 20 may be flipped as a whole toward the back side of the silicon-based panel 10 and placed in coincidence with the silicon-based panel 10. The flexible circuit board 20 and the logic control board 30 disposed on the flexible circuit board 20 do not occupy additional area.

Figure 5:
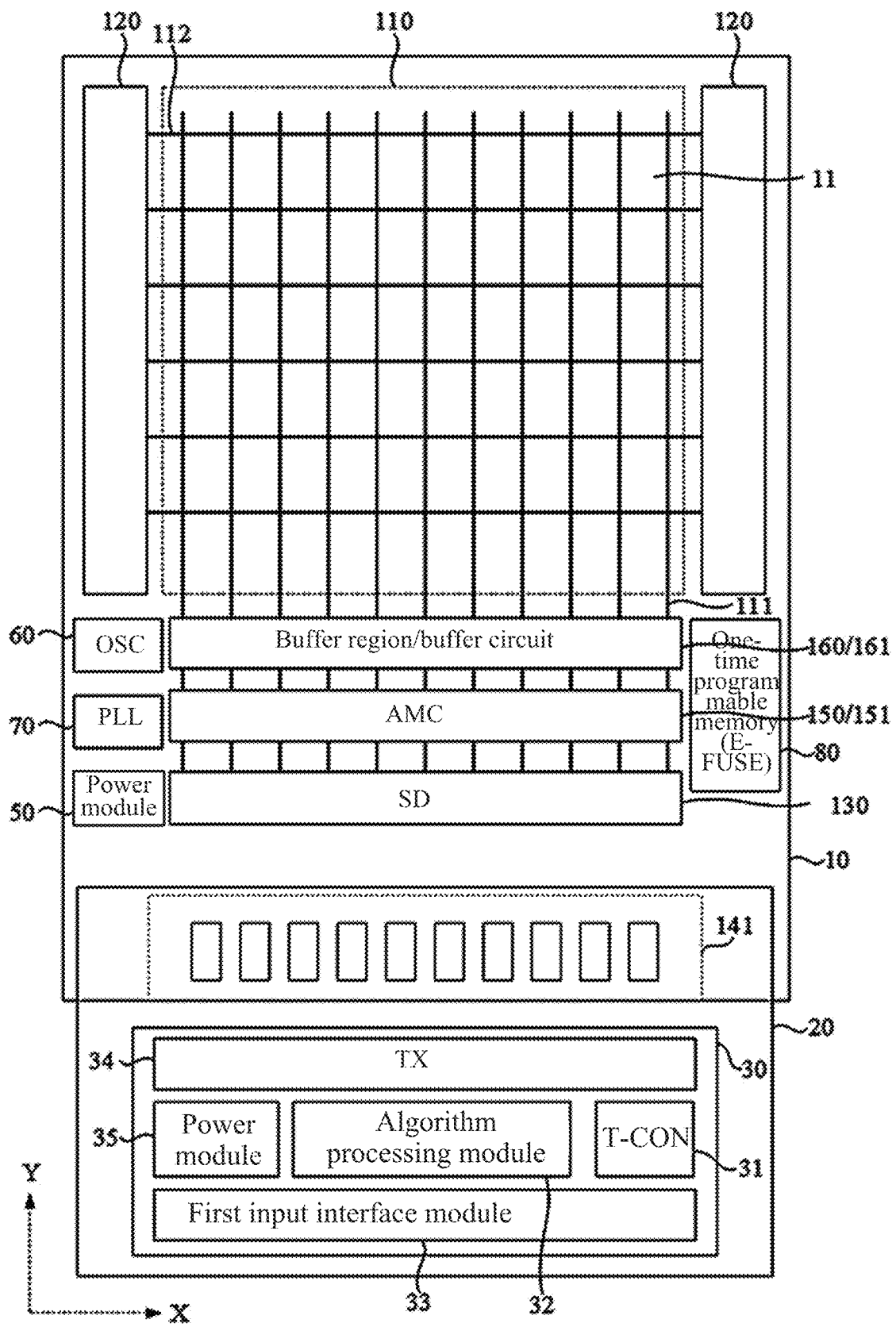
FIG. 5 is a diagram illustrating the structure of another silicon-based display assembly according to an embodiment of the present application.
Figure 6:
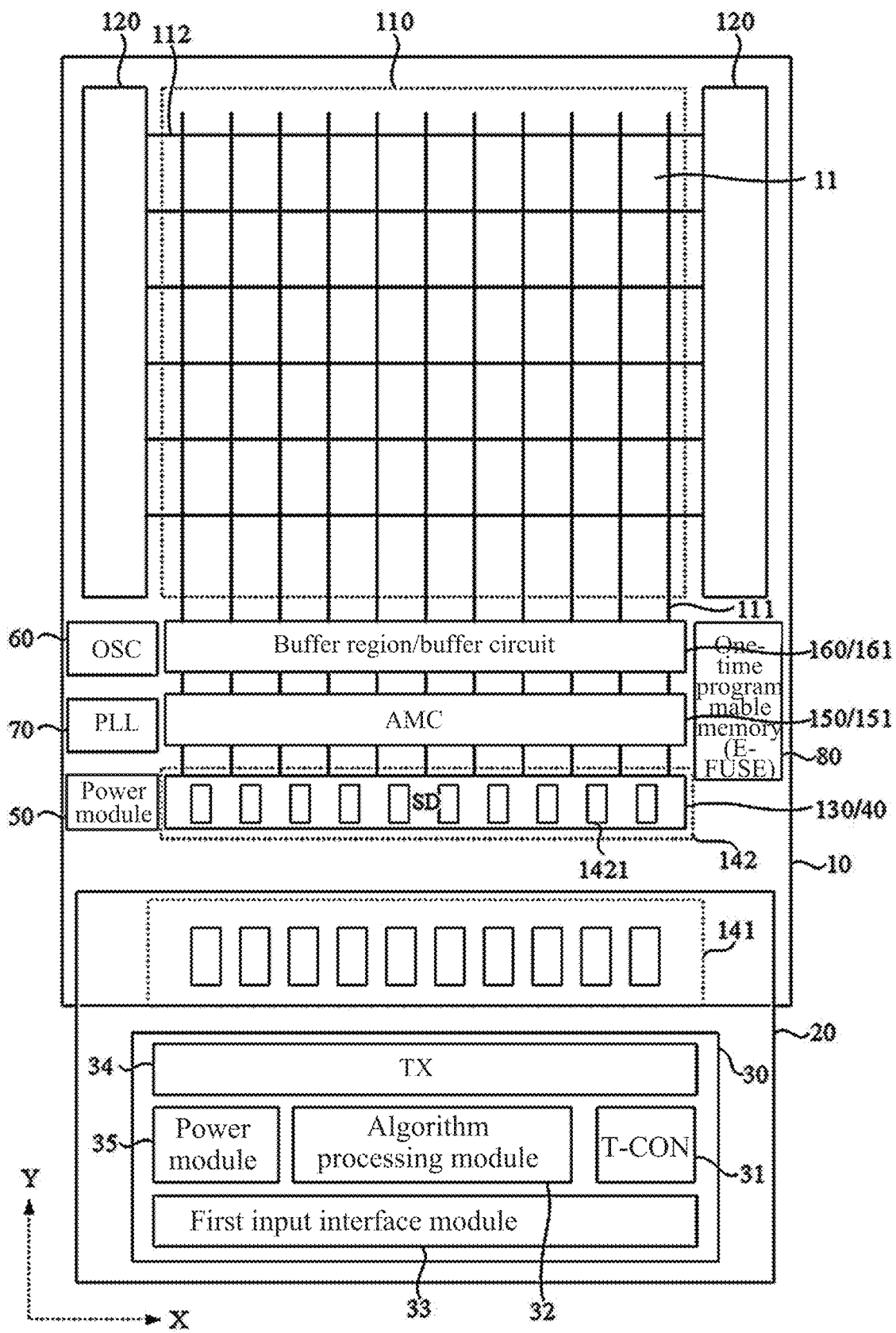
FIG. 6 is a diagram illustrating the structure of another silicon-based display assembly according to an embodiment of the present application.

FIG. 5 is a diagram illustrating the structure of another silicon-based display assembly according to an embodiment of the present application. FIG. 6 is a diagram illustrating the structure of another silicon-based display assembly according to an embodiment of the present application. Referring to FIG. 5 and FIG. 6, on the basis of the solution of the preceding embodiment, the silicon-based panel also includes an analog memory region 150 and a buffer region 160. Specifically, in conjunction with FIG. 5 and FIG. 2, in addition to the source signal driver circuit 130, the silicon-based panel 10 also includes an analog memory region 150 and a buffer region 160. The analog memory region 150 and the buffer region 160 are successively arranged between the source signal driver circuit 130 and the display region 110. In conjunction with FIG. 6 and FIG. 4, the silicon-based panel 10 is provided with an analog memory region 150 and a buffer region 160. The analog memory region 150 and the buffer region 160 are successively arranged between the source signal driver chip 40 and the display region 110.

The analog memory region 150 is integrated with an analog memory circuit (AMC) 151. The analog memory circuit (AMC) 151 is configured to store, in a first stage, the data signal generated by the source signal driver circuit 130 and transmitted to the data signal lines 111.

The buffer region 160 is integrated with a buffer circuit 161. The buffer circuit 161 is electrically connected to the analog memory circuit (AMC) 151 and the data signal lines 111. The buffer circuit 161 is configured to be transmitted, in a second stage, the data signal stored in the analog memory circuit (AMC) 151 to the data signal lines 111.

The first stage and the second stage are two non-overlapping stages in the driving process of the pixel units 11.

Further referring to FIG. 1, the silicon-based display assembly having 8K resolution and 120 Hz frame rates is also used as an example. The scan time of a row of pixel units 11' in the silicon-based display assembly is 1 microsecond. The scan duration of each row of pixel units 11F is too short. The power supply time of a single data signal line 111' is only 1 microsecond. The data signal line 111' does not have enough time to charge the pixel units 11', which may easily cause the pixel units 11' to fail to reach the target brightness. As a result, the display effect is poor. In the embodiment, the process in which the source signal driver circuit 130 drives the pixel units 11 in the display region 110 is divided into two stages, that is, the first stage and the second stage. In the first stage, the data signal is stored in the analog memory circuit (AMC) 151 in the analog memory region 150, and in the second stage, the stored data signal is transmitted to the data signal lines 111, thereby preventing the data signal from being directly transmitted to the data signal lines 111 during the process in which the data signal is written into the source signal driver circuit 130. It can be seen that in the embodiment, in the case where the silicon-based panel is also provided with an analog memory region 150 and a buffer region 160 and is configured to directly separate the source signal driver circuit 130 from the data signal lines 111, and the source signal driver circuit 130 inputs a data signal into the analog memory region 150, the buffer region 160 is in an off state. At this time, the load of the source signal driver circuit 130 is essentially only the analog memory circuit (AMC) 151 in the analog memory region 150. Moreover, since the analog memory circuit (AMC) 151 is generally simple, compared with a data signal line 111 and a column of pixel units 11' connected to the data signal line 111, the load of the source signal driver circuit 130 may be greatly reduced, thereby implementing an impedance conversion function. In this manner, the speed of data signal writing may be greatly improved, so that the problem that the time for writing a data signal to each row of pixel units is too short to satisfy charging requirements is avoided. Thus, it can be ensured that each pixel unit is fully charged, and the pixel units emit light accurately, thereby improving the display effect.

Figure 7:
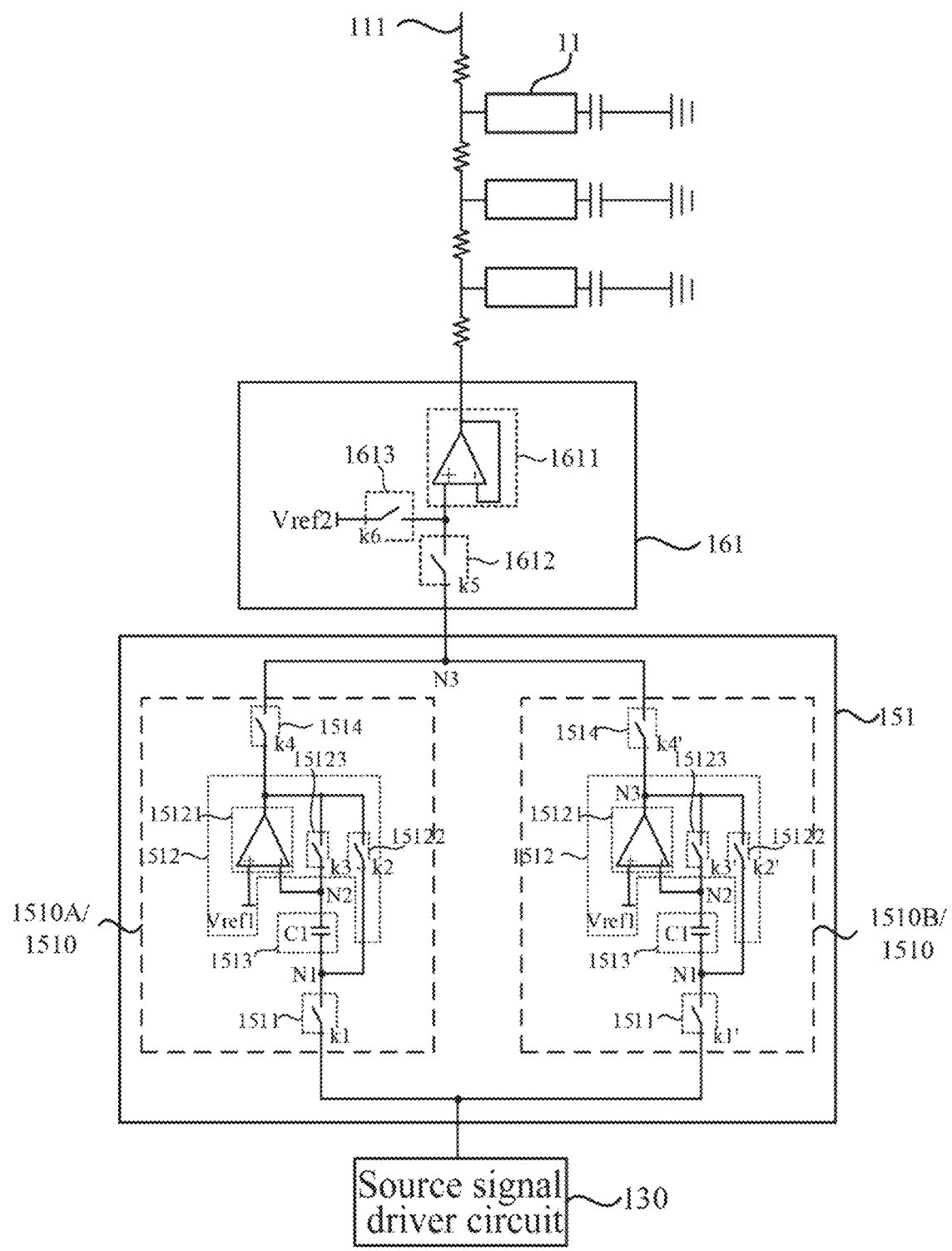
FIG. 7 is a diagram illustrating the circuit structure of an analog memory region and a buffer region in the silicon-based display assembly shown in FIG. 5 and FIG. 6.
Figure 8:
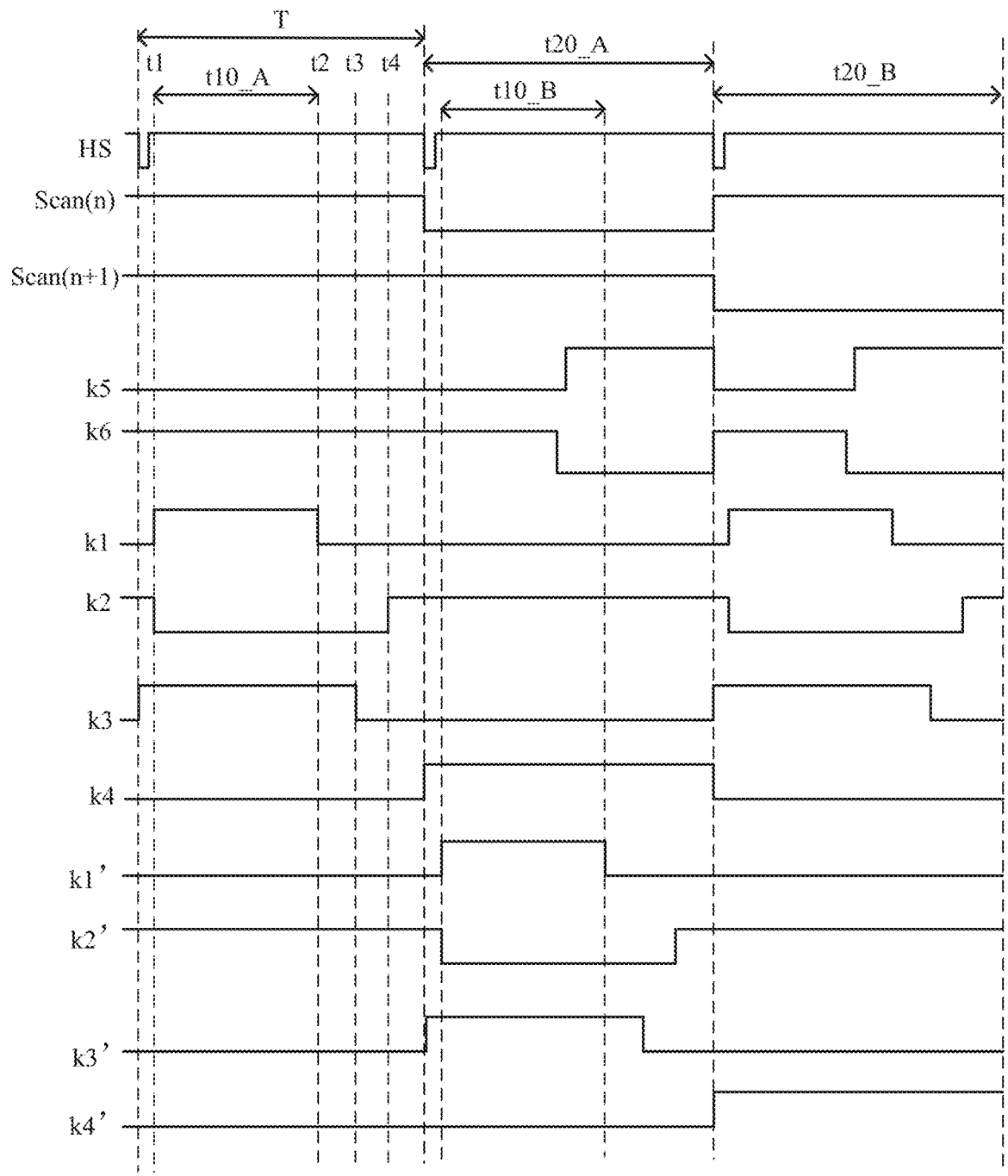
FIG. 8 is a control timing diagram of an analog memory circuit and a buffer circuit shown in FIG. 7.

FIG. 7 is a diagram illustrating the circuit structure of an analog memory region and a buffer region in the silicon-based display assembly shown in FIG. 5 and FIG. 6. FIG. 8 is a control timing diagram of an analog memory circuit and a buffer circuit shown in FIG. 7. Referring to FIG. 5 to FIG. 8, specifically, the analog memory circuit (AMC) 151 includes two memory units 1510. The two memory units 1510 are a first memory unit 1510A and a second memory unit 1510B respectively. The first memory unit 1510A and the second memory unit 1510B are electrically connected to the same buffer circuit 161 at a third node N3.

Each storage unit 1510 includes a first switch 1511, a node stabilization unit 1512, and a memory sub-unit 1513. The first switch 1511 is electrically connected to the memory sub-unit 1513 and the source signal driver circuit 130. The first switch 1511 is electrically connected to the memory sub-unit 1513 at a first node N1. The memory sub-unit 1513 is also electrically connected to the node stabilization unit 1512 at a second node N2 and a third node N3. The node stabilization unit 1512 is also electrically connected to the buffer circuit 161 at the third node N3. A fourth switch 1514 is electrically connected between the third node N3 and the node stabilization unit 1512.

The data driving process of the pixel units 11 includes a first stage t10 and a second stage t20. The first switch 1511 is configured to be turned on in the first stage t10 to control the data signal provided by the source signal driver circuit 130 to write into the first node N1 and store in the memory sub-unit 1513. The node stabilization unit 1512 is configured to be turned on in the first stage t10 to control the voltage of the second node N2 and the voltage of the third node N3 to maintain at a first voltage and control the data signal stored in the memory sub-unit 1513 to provide to the third node N3 in the second stage t20.

In two adjacent pixel units 11 electrically connected to the same data signal line 111, the pixel unit 11 located in a previous row is the pixel unit 11 in the n-th row, and the pixel unit 11 located in a following row is the pixel unit 11 in the (n+1)th row. n is a positive integer. The first memory unit 1510A is configured to control the data signal of the pixel unit 11 in the n-th row to be transmitted to the buffer circuit 161. The second memory unit 1510B is configured to control the data signal of the pixel unit 11 in the (n+1)th row to be transmitted to the buffer circuit 161. The second stage t20 in the data driving process of the pixel unit 11 in the n-th row at least partially overlaps with the first stage t10 in the data driving process of the pixel unit 11 in the (n+1)th row.

Further referring to FIG. 7 and FIG. 8, more specifically, the memory sub-unit 1513 includes a first capacitor C1. A first pole plate of the first capacitor C1 is electrically connected to the first node N1. A second pole plate of the first capacitor C1 is electrically connected to the second node N2.

The node stabilization unit 1512 includes an operational transconductance amplifier 15121, a second switch 15122, and a third switch 15123. The non-inverting input terminal of the operational transconductance amplifier 15121 is electrically connected to a reference voltage source Vref1. The inverting input terminal of the operational amplifier 121 is electrically connected to the second node N2. The output terminal of the operational transconductance amplifier 15121 is electrically connected to the third node N3. The third switch 15123 is electrically connected between the second node N2 and the third node N3. The second switch 15122 is electrically connected between the first node N1 and the third node N3. The third switch 15123 is configured to be turned on in the first stage t10 to enable the voltage of the second node N2 and the voltage of the third node N3 to be the same. The second switch 15122 is configured to be turned on in the second stage t20 to enable the voltage of the first node N1 and the voltage of the third node N3 to be the same.

Each memory unit 1510 also includes a fourth switch 1514. The fourth switch 1514 of the first memory unit 1510A is configured to be turned on in the second stage in the data driving process of the pixel unit in the n-th row. The fourth switch 1514 of the second memory unit 1510B is configured to be turned on in the second stage in the data driving process of the pixel unit in the (n+1)th row.

Referring to FIG. 7 and FIG. 8, in this embodiment of the present application, the buffer circuit 161 may include a first operational amplifier 1611, a fifth switch 1612, and a sixth switch 1613. The fifth switch 1612 is electrically connected to the third node N3 and the non-inverting input terminal of the first operational amplifier 1611. The inverting input terminal of the first operational amplifier 1611 is electrically connected to the output terminal of the first operational amplifier 1611. The output terminal of the first operational amplifier 1611 is electrically connected to a data signal line 111.

The second stage t20 includes a first sub-stage t21 and a second sub-stage t22 in succession. The first sub-stage t21 is located between the first stage t10 and the second sub-stage t22. The fifth switch 1612 is configured to be turned off in the first sub-stage t21 and turned on in the second sub-stage t22 to control the signal of the third node N3 to be transmitted to the non-inverting input terminal of the first operational amplifier 1611.

The sixth switch 1613 is electrically connected between a precharge voltage signal terminal Vref2 and the non-inverting input terminal of the first operational amplifier 1611. The sixth switch 1613 is configured to be turned on during a period between the start occasion of the first stage t10 and the end occasion of the first sub-stage t21 to enable the precharge voltage signal vref2 of the precharge voltage signal terminal Vref2 to be provided to the non-inverting input terminal of the first operational amplifier 1611.

Referring to FIG. 7 and FIG. 8, the operation process and the data writing process of the analog memory circuit (AMC) 151 and the buffer circuit 161 are described in detail. Here, for example, the on signals for controlling the first switch 1511, the second switch 15122, the third switch 15123, the fourth switch 1514, the fifth switch 1612, and the sixth switch 1613 are all at logic high level, and the off signals for controlling the first switch 1511, the second switch 15122, the third switch 15123, the fourth switch 1514, the fifth switch 1612, and the sixth switch 1613 are all at logic low level. Moreover, as shown in FIG. 7, the signal for controlling the first switch 1511 in the first memory unit 1510A to turn on/off is k1. The signal for controlling the second switch 15122 in the first memory unit 1510A to turn on/off is k2. The signal for controlling the third switch 15123 in the first memory unit 1510A to turn on/off is k3. The signal for controlling the fourth switch 1514 in the first memory unit 1510A to turn on/off is k4. The signal for controlling the first switch 1511 in the second memory unit 1510B to turn on/off is k1'. The signal for controlling the second switch 15122 in the second memory unit 1510B to turn on/off is k2'. The signal for controlling the third switch 15123 in the second memory unit 1510B to turn on/off is k3'. The signal for controlling the fourth switch 1514 in the second memory unit 1510B to turn on/off is k4'. The signal for controlling the fifth switch 1612 in the buffer circuit 161 to turn on/off is k5. The signal for controlling the sixth switch 1613 in the buffer circuit 161 to turn on/off is k6. Scan(n) denotes the scanning signal in the n-th row. Scan (n+1) denotes the scanning signal in the (n+1)th row. The data driving process of the pixel unit 11 in the n-th row may include a first stage t10_A and a second stage t20_A. The first memory unit 1510A completes data memory and transmission. The data driving process of the pixel unit 11 in the (n+1)th row may include a first stage t10_B and a second stage t20_B. The second memory unit 1510B completes data memory and transmission. In addition, in the drive timing shown in FIG. 8, the first stage t10_B in the data driving process of the pixel unit 11 in the (n+1)th row is located in the second stage t20_A in the data driving process of the pixel unit 11 in the n-th row. The specific driving process is described below.

In the first stage t10_A in the data driving process of the pixel unit 11 in the n-th row, the scanning signal Scan(n) in the n-th row is at logic high level, and the pixel unit 11 in the n-th row is in an off state. At the same time, in the first memory unit 1510A, k1 is at logic high level, the first switch 1511 is turned on, and the data signal provided by the source signal driver circuit 130 is written into the first node N1 and stored in the first capacitor C1; k2 is at logic low level, and the second switch 15122 is turned off, k3 is at logic high level, the third switch 15123 is turned on, and the voltage of the second node N2 is consistent with the voltage at the output terminal of the operational transconductance amplifier 15121 and is stabilized to be the sum of the reference voltage Vref1 at a non-inverting input terminal and the offset voltage Vos of the operational transconductance amplifier 15121, that is, Vref1+Vos; and k4 is at logic low level, and the fourth switch 1514 is turned off.

In the second stage t20_A in the data driving process of the pixel unit 11 in the n-th row, the scanning signal Scan(n) in the n-th row is at logic low level, and the pixel unit 11 in the n-th row is in an on state. At the same time, in the first memory unit 1510A, k1 is at logic low level, and the first switch 1511 is turned off, k2 is at logic high level, the second switch 15122 is turned on, k3 is at logic low level, k4 is at logic high level, the first node N1 is short-circuited with the third node N3, and the data signal stored in the first capacitor C1 in the first stage t10_A is provided to the third node N3; and k5 changes from logic low level to logic high level, k6 changes from logic high level to logic low level, the fifth switch 1612 is switched from the off state to the on state, the sixth switch 1613 is switched from the on state to the off state, and the data signal of the third node N3 is amplified by the first operational amplifier 1611 and then written into the pixel unit 11 in the n-th row.

In the first stage t10_B in the data driving process of the pixel unit 11 in the (n+1)th row, the scanning signal Scan (n+1) in the (n+1)th row is at logic high level, and the pixel unit 11 in the (n+1)th row is in an off state. At the same time, in the second memory unit 1510B, k1' is at logic high level, the first switch 1511 is turned on, and the data signal provided by the source signal driver circuit 130 is written into the first node N1 and stored in the first capacitor C1; k2' is at logic low level, and the second switch 15122 is turned off; k3' is at logic high level, the third switch 15123 is turned on, and the voltage of the second node N2 is consistent with the voltage at the output terminal of the operational transconductance amplifier 15121 and is stabilized to be the sum of the reference voltage Vref1 at the non-inverting input terminal and the offset voltage Vos of the operational transconductance amplifier 15121, that is, Vref1+Vos; and k4' is at logic low level, and the fourth switch 1514 is turned off.

In the second stage t20_B in the data driving process of the pixel unit 11 in the (n+1) th row, the scanning signal Scan(n+1) in the (n+1)th row is at logic low level, and the pixel unit 11 in the (n+1)th row is in an on state. At the same time, in the second memory unit 1510B, k1' is at logic low level, and the first switch 1511 is turned off; k2' is at logic high level, the second switch 15122 is turned on, k3' is at logic low level, k4' is at logic high level, the first node N1 is short-circuited with the third node N3, and the data signal stored in the first capacitor C1 in the first stage t10_B is provided to the third node N3; and k5 changes from logic low level to logic high level, k6 changes from logic high level to logic low level, the fifth switch 1612 is switched from the off state to the on state, the sixth switch 1613 is switched from the on state to the off state, and the data signal of the third node N3 is amplified by the first operational amplifier 1611 and then written into the pixel unit 11 in the (n+1)th row.

It can be seen that in this embodiment of the present application, the second stage t20_A of the pixel unit 11 in the n-th row overlaps the first stage t10_B of the pixel unit 11 in the (n+1) th row, so that in the case where a memory unit 1510, that is, the first memory unit 1510A, performs the second stage operation, another memory unit 1510, that is, the second memory unit 1510B performs the first stage operation. In this manner, it can be ensured that data signals may be written into two adjacent rows of pixel units 11 of the data signal line 111 in sequence with a short time interval or even without a time interval, thereby saving the writing time of the data signals and improving the input efficiency.

In addition, in the first part of the time period in the second stage t20_A in the data driving process of the pixel unit 11 in the n-th row and in the first part of the time period in the second stage t20_B in the data driving process of the pixel unit 11 in the (n+1)th row, k5 is at logic low level, k6 is at logic high level, the fifth switch 1612 is turned off; and the sixth switch 1613 is turned on, the precharge voltage signal of the precharge voltage signal terminal Vref2 is amplified by the first operational amplifier 1611 and then used to pre-charge the pixel unit 11 of the n-th row. In this manner, not only the data signal of the previous frame may prevent from affecting the display of the next frame, thereby improving the display effect, but also the writing speed of the data signal may be improved.

Further referring to FIG. 8, for the pixel unit 11 in any row, in an actual driving process, the pixel unit 11 in the n-th row is used as an example, and a time period between an occasion t2 and an occasion t3 may also be set. k1 and k2 are at logic low level. k3 is at logic high level. The first switch 1511 and the second switch 15122 are turned off. The third switch 15123 is turned on. In this manner, the voltage of the second node N2 and the voltage of the third node N3 are maintained at Vref1+Vos. The voltage of the second node N2 or the voltage of the third node N3 is prevented from changing and affecting the voltage of the first node N1 due to the coupling effect of the memory unit 1510. The voltage of the first node N1 is maintained at the voltage of the data signal.

Optionally, a time period between an occasion t3 and an occasion t4 may also be set. k1, k2, and k3 are all at logic low level. The first switch 1511, the second switch 15122, and the third switch 15123 are all turned off. Further, the voltage at two terminals of the first capacitor C1 remains unchanged.

Referring to FIG. 2, FIG. 4, FIG. 5, and FIG. 6, optionally, the silicon-based panel 10 is also integrated with a power module 50, an oscillator (OSC) 60, a phase-locked loop (PLL) 70, and a one-time programmable memory (E-FUSE) 80. The power module 50, the oscillator (OSC) 60, the phase-locked loop (PLL) 70, and the one-time programmable memory (E-FUSE) 80 are disposed on two sides of the analog memory region 150 and two sides of the buffer region 160 in the first direction X respectively. In other embodiments, the above modules may also be disposed in other regions outside the display region 110 of the silicon-based panel 10.

In this embodiment, the power module 50, the oscillator (OSC) 60, the phase-locked loop (PLL) 70, and the one-time programmable memory (E-FUSE) 80 are also disposed on the silicon-based panel. Since the manufacturing technique of these modules or circuits is consistent or close to the manufacturing technique of the pixel units in the display region, compared with the source signal driving portion and the image data receiving and processing portion which have complex processes and require precision and are manufactured in the form of independent chips, these modules or circuits have lower technique requirements and do not require a manufacturing process with strong technique capabilities to be manufactured, thereby simplifying the technique and saving costs.

The driving architecture provided in this embodiment of the present application is a high-resolution and high-frame-rate driving system architecture and is particularly suitable for a silicon-based micro display panel. The silicon-based micro display panel is suitable for near-eye display such as virtual reality (VR) display and augmented reality (AR) display. The panel size of silicon-based micro display panel is very small, only the size of a coin. The images displayed by the silicon-based micro display panel need to be amplified by an optical magnification system. At the same time, the pixel size of the silicon-based micro display panel is much smaller than the pixel size of a traditional pixel. In the case of near-eye display, the human eye cannot distinguish individual pixels, thus avoiding the influence of screen-door effect, that is, the silicon-based micro display panel requires high resolution. The silicon-based micro display panel also has high-frame-rate requirements. In the near-eye display, the human eye cannot distinguish the pause between two frames, and the smooth, delicate, and clear display effect is provided.

Figure 9:
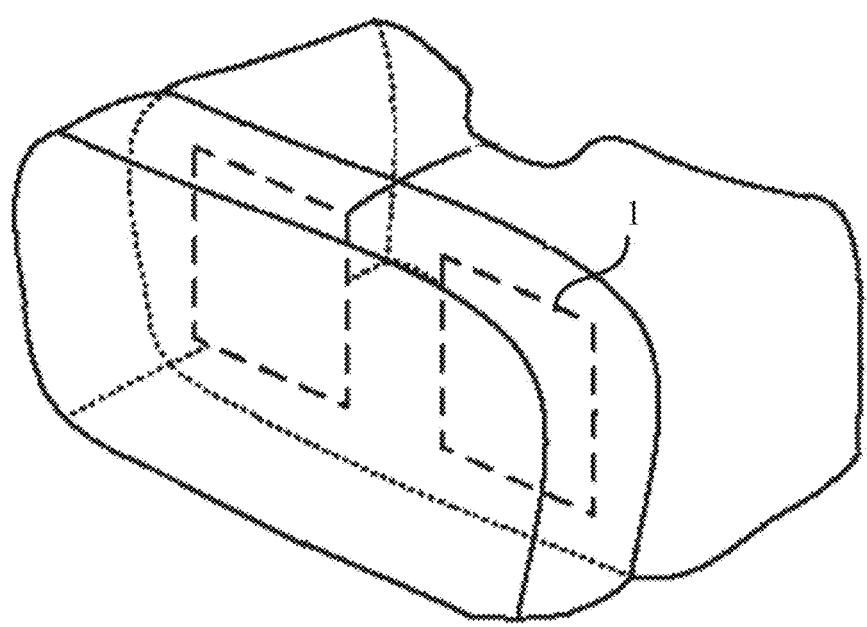
FIG. 9 is a diagram illustrating the structure of a display device according to an embodiment of the present application.

An embodiment of the present application provides a display device. FIG. 9 is a diagram illustrating the structure of a display device according to an embodiment of the present application. Referring to FIG. 9, the display device includes any silicon-based display assembly 1 provided by the preceding embodiments. Moreover, since the display device includes the silicon-based display assembly 1 provided by the embodiments of the present application, the display device has the same or similar effect as the silicon-based display assembly 1 provided by the embodiments of the present application, and the details are not redundantly repeated. The display device may be a display device such as a mobile phone, a tablet, a computer, VR, or AR.

It is to be noted that the preceding are only optional embodiments of the present application and the technical principles used therein. The present application is not limited to the embodiments described herein. Various apparent modifications, readjustment, combinations, and substitutions can be made without departing from the scope of the present application. Therefore, while the present application is described in detail in connection with the preceding embodiments, the present application is not limited to the preceding embodiments and may include equivalent embodiments without departing from the concept of the present application. The scope of the present application is determined by the scope of the appended claims.

What is claimed is:

1. A silicon-based display assembly, comprising:
a silicon-based panel comprising a display region, a gate row driver circuit, a source signal driver circuit, and a first bonding region, wherein the display region comprises: a plurality of data signal lines and a plurality of gate scanning lines, the plurality of data signal lines are arranged in sequence in a first direction and extend in a second direction, and the plurality of gate scanning lines are arranged in sequence in the second direction and extend in the first direction; the display region further comprises a plurality of pixel units formed by intersection of the plurality of data signal lines and the plurality of gate scanning lines; the gate row driver circuit is configured to provide a gate scanning signal to the plurality of gate scanning lines, and the source signal driver circuit is configured to provide a data signal to the plurality of data signal lines; and the first direction and the second direction are two directions arbitrarily intersecting on a plane where the silicon-based panel is located;
a flexible circuit board having an end bonded to the first bonding region; and
a logic control board disposed on the flexible circuit board;
wherein the logic control board is integrated with a timing controller module, an algorithm processing module, a first input interface module, a first output interface module, and a power module, and the logic control board is configured to at least perform high-speed data receiving and high-speed data processing;
wherein the source signal driver circuit is integrated with a shift register module, a line buffer module, a level shift module, a digital-to-analog conversion module, a data signal operation amplifier module, a second input interface module, and a gamma voltage generation module; and
the shift register module, the line buffer module, the level shift module, the digital-to-analog conversion module, and the data signal operation amplifier module are electrically connected in sequence, the second input interface module is electrically connected to the shift register module, and the gamma voltage generation module is electrically connected to the digital-to-analog conversion module; and a communication protocol of the second input interface module matches a communication protocol of the first output interface module.

2. The silicon-based display assembly according to claim 1, further comprising: a source signal driver board bonded to the silicon-based panel,
wherein the source signal driver circuit is integrated in the source signal driver board.

3. The silicon-based display assembly according to claim 2, wherein the silicon-based panel further comprises: a second bonding region, the second bonding region comprises a plurality of pads, and the source signal driver board is bonded to the silicon-based panel through the plurality of pads.

4. The silicon-based display assembly according to claim 1, wherein the silicon-based panel further comprises: an analog memory region and a buffer region, and the analog memory region and the buffer region are sequentially arranged between the source signal driver circuit and the display region;
an analog memory circuit is integrated in the analog memory region, and the analog memory circuit is configured to store, in a first stage, the data signal generated by the source signal driver circuit and transmitted to the plurality of data signal lines; and
a buffer circuit is integrated in the buffer region, the buffer circuit is electrically connected to the analog memory circuit and the plurality of data signal lines, and the buffer circuit is configured to transmit, in a second stage, the data signal stored in the analog memory circuit to the plurality of data signal lines,
wherein the first stage and the second stage are two non-overlapping stages in a driving process of the plurality of pixel units.

5. The silicon-based display assembly according to claim 4, wherein the analog memory circuit comprises a first memory unit and a second memory unit, and the first memory unit and the second memory unit are electrically connected to a same buffer circuit at a third node;
each memory unit of the first memory unit and the second memory unit comprises a first switch, a node stabilization unit, and a memory sub-unit;
the first switch is electrically connected to the memory sub-unit and the source signal driver circuit, and the first switch is electrically connected to the memory sub-unit at a first node; the memory sub-unit is further electrically connected to the node stabilization unit at a second node and a third node; and the node stabilization unit is further electrically connected to the buffer circuit at the third node;
a data driving process of the plurality of pixel units comprises the first stage and the second stage;
the first switch is configured to be turned on in the first stage to control the data signal provided by the source signal driver circuit to be written into the first node and stored in the memory sub-unit;

the node stabilization unit is configured to control a voltage of the second node and a voltage of the third node to be maintained at a first voltage in the first stage and control the data signal stored in the memory sub-unit to be provided to the third node in the second stage;

in two adjacent pixel units of the plurality of pixel units electrically connected to a same data signal line of the plurality of data signal lines, a pixel unit located in a previous row is the pixel unit in an n-th row, and a pixel unit located in a following row is the pixel unit in a (n+1)th row, wherein n is a positive integer; and the first memory unit is configured to control a data signal of the pixel unit in the n-th row to be transmitted to the buffer circuit, and the second memory unit is configured to control a data signal of the pixel unit in the (n+1)th row to be transmitted be transmitted to the buffer circuit, wherein a second stage in a data driving process of the pixel unit in the n-th row at least partially overlaps with a first stage in a data driving process of the pixel unit in the (n+1)th row.

6. The silicon-based display assembly according to claim 5, wherein the memory sub-unit comprises a first capacitor; and a first pole plate of the first capacitor is electrically connected to the first node, and a second pole plate of the first capacitor is electrically connected to the second node;

the node stabilization unit comprises an operational transconductance amplifier, a second switch, and a third switch; a non-inverting input terminal of the operational transconductance amplifier is electrically connected to a reference voltage source, an inverting input terminal of the operational transconductance amplifier is electrically connected to the second node, and an output terminal of the operational transconductance amplifier is electrically connected to the third node; the third switch is electrically connected between the second node and the third node; and the second switch is electrically connected between the first node and the third node; and the third switch is configured to be turned on in the first stage comprised in the data driving process of the plurality of pixel units to enable the voltage of the second node and the voltage of the third node to be the same; and the second switch is configured to be turned on in the second stage comprised in the data driving process of the plurality of pixel units to enable a voltage of the first node and the voltage of the third node to be the same.

7. The silicon-based display assembly according to claim 5, wherein the each memory unit further comprises a fourth switch, and the fourth switch is electrically connected between the third node and the node stabilization unit; and the fourth switch of the first memory unit is configured to be turned on in the second stage in the data driving process of the pixel unit in the n-th row; and the fourth switch of the second memory unit is configured to be turned on in a second stage in the data driving process of the pixel unit in the (n+1)th row.

8. The silicon-based display assembly according to claim 5, wherein the buffer circuit comprises a first operational amplifier, a fifth switch, and a sixth switch;

the fifth switch is electrically connected to the third node and a non-inverting input terminal of the first operational amplifier;

an inverting input terminal of the first operational amplifier is electrically connected to an output terminal of the first operational amplifier, and the output terminal of the first operational amplifier is electrically connected to one of the plurality of data signal lines;

the second stage comprised in the data driving process of the plurality of pixel units comprises a first sub-stage and a second sub-stage in succession, and the first sub-stage is located between the first stage comprised in the data driving process of the plurality of pixel units and the second sub-stage;

the fifth switch is configured to be turned off in the first sub-stage and turned on in the second sub-stage to control a signal of the third node to be transmitted to the non-inverting input terminal of the first operational amplifier;

the sixth switch is electrically connected between a precharge voltage signal terminal and the non-inverting input terminal of the first operational amplifier; and the sixth switch is configured to be turned on during a period between a start occasion of the first stage and an end occasion of the first sub-stage to enable a precharge voltage signal of the precharge voltage signal terminal to be provided to the non-inverting input terminal of the first operational amplifier.

9. The silicon-based display assembly according to claim 4, wherein a power module, an oscillator, a phase-locked loop, and a one-time programmable memory are further configured in the silicon-based panel; and the power module, the oscillator, the phase-locked loop, and the one-time programmable memory are disposed in a region outside the display region respectively.

10. The silicon-based display assembly according to claim 1, wherein the first input interface module is a high-speed interface module, and the first output interface module and the second input interface module are low-speed interface modules.

11. The silicon-based display assembly according to claim 10, wherein an interface in the high-speed interface module comprises a mobile industry processor interface (MIPI) or an embedded display port (eDP), and an interface in the low-speed interface modules comprises a low voltage differential signaling (LVDS) interface or a point-to-point (P2P) interface.

12. A display device, comprising the silicon-based display assembly according to claim 1.

* * * * *